United States Patent [19]
Lee

[11] Patent Number: 5,895,936
[45] Date of Patent: Apr. 20, 1999

[54] IMAGE CAPTURE DEVICE USING A SECONDARY ELECTRODE

[75] Inventor: Denny Lap Yen Lee, West Chester, Pa.

[73] Assignee: Direct Radiography Co., Newark, Del.

[21] Appl. No.: 08/890,290

[22] Filed: Jul. 9, 1997

[51] Int. Cl.[6] ................................. H01L 31/00
[52] U.S. Cl. .................. 257/59; 257/444; 257/448; 250/370.09; 250/370.11; 250/580; 250/591
[58] Field of Search ................... 257/443, 448, 257/59, 444; 250/580, 370.09, 370.11, 591

[56] References Cited

U.S. PATENT DOCUMENTS

| | | | |
|---|---|---|---|
| 5,003,356 | 3/1991 | Wakai et al. | 357/4 |
| 5,032,883 | 7/1991 | Wakai et al. | 357/23.7 |
| 5,313,066 | 5/1994 | Lee et al. | 250/370.09 |
| 5,319,206 | 6/1994 | Lee et al. | 250/370.09 |
| 5,352,897 | 10/1994 | Horikawa et al. | 250/370.06 |
| 5,396,072 | 3/1995 | Schiebel et al. | 250/370.09 |
| 5,463,225 | 10/1995 | Kwasnick et al. | 250/370.11 |
| 5,498,880 | 3/1996 | Lee et al. | 250/580 |
| 5,563,421 | 10/1996 | Lee et al. | 250/580 |

Primary Examiner—William Mintel
Attorney, Agent, or Firm—Ratner & Prestia

[57] ABSTRACT

An image capture panel particularly useful in radiographic application is disclosed, in which the active image capture area of individual sensors having top and bottom charge collecting microplates arrayed in rows and columns is extended by providing an additional charge capture conductive strip over sensor areas which are not normally covered by a charge collecting microplate. The strip may be made integral with the top microplate or may be separate and electrically connected thereto at a single point.

5 Claims, 4 Drawing Sheets

IMAGE CAPTURE DEVICE USING A SECONDARY ELECTRODE

BACKGROUND OF THE INVENTION

1. Field of the Invention

This invention relates to a solid state radiographic imaging device and more particularly to a device having a plurality of sensors with extended active image capturing surface area.

2. Description of Related Art

Advances in solid state electronic component technology have led to the development of image capture panels comprising two dimensional arrays of individual sensors. Such panels have found applications in radiography wherein the panel is exposed to modulated X-ray radiation carrying imaging information. The image information is stored in the individual sensors typically in the form of charges trapped in a capacitor. These charges which represent the image are read out of the array capacitors and following electronic processing, the charges are stored for display as a visible image. When the radiation is X-ray radiation which impinges on the panel after passing through a patient, the end result is a medical radiogram.

U.S. Pat. No. 5,319,206 issued to Lee et al on Jun. 7, 1994 describes a system which employs such a panel to capture a radiogram.

The panels, as stated above, comprise a two dimensional array of sensors with associated switching and addressing circuitry built on an insulating substrate, usually a glass plate. Such sensors typically include a pair of generally coplanar conductive microplates separated by a dielectric layer. Extending over all the sensors above the microplates is a photoconductive layer which is sensitive to X-ray radiation. A top electrode is placed over the photoconductive layer.

The two microplates in each sensor serve to collect and store charges representing the radiation exposure of the sensor. Radiation exposure is the product of the radiation intensity and the time duration of radiation impingement on the sensor.

In operation, a charging voltage is applied to the bottom microplates of all sensors and the top electrode. This creates an electric field in the photoconductive layer. Upon exposure to radiation, electron/hole pairs are generated in the photoconductive layer by the absorbed radiation exposure energy. Under the influence of the applied electric field the electrons and holes produced separate and migrate along the field lines toward the top electrode and toward the microplates. In detector structures where a positive charging voltage is applied to the top electrode, electrons move along the field lines toward the top electrode, and holes migrate toward the top microplates. The hole migration results in a charge accumulation during exposure in the charge storage capacitors formed by the two microplates and the dielectric separating them. Subsequent removal of the charging voltage and the exposing radiation leaves the accumulated charges trapped in the capacitors.

As can be seen by this brief description of the panel operation, the charges are captured in the sensor areas covered by the microplates. These areas are typically confined by orthogonal intersecting columns and rows of interstitial spaces in which run conductive strips which are used to address the individual sensors, to recover the stored charges during readout of the image, and to apply the charging voltage to the bottom microplates.

In order to individually address each sensor, a solid state switch is built in each sensor. One side of the switch is connected to the top microplate. A typical addressing and switching arrangement uses a TFT transistor switch constructed in a cutout portion of the microplates. The technology to produce TFT transistor switches is disclosed in U.S. Pat. Nos. 5,003,356 and 5,032,883.

The area occupied by the TFT transistor, the charging lines, the data strips and the addressing strips are non imaging areas. It is therefore important to minimize them. However very little can be done to minimize the area occupied by the switching element, and there are practical limits as to how close to the data and address strips can the microplates be built without risking shortages.

The prior art has attempted to extend the image capture area by a sensor structure as shown in FIGS. 1 and 2 which are a schematic cross-sectional elevation and a top view of a typical prior art sensor.

As shown in FIG. 2, the sensor includes a substrate 9, which may be a glass plate, a bottom microplate 12 and a top microplate 14. Microplates 12 and 14 are separated by a dielectric layer 13. Each sensor includes a TFT transistor switch 15. The TFT switch has a gate electrode 16 built on the glass substrate 9. The TFT gate electrode is covered by an insulating layer which can be the same as dielectric layer 13. In addition to the gate electrode, it includes a drain electrode 18, a source electrode 20 and a semiconductor material 19. The drain electrode 18, is the electrode which receives the data signal from the capacitor, and is directly connected to a top microplate 14.

As shown in FIG. 1, the source electrode 20 is connected to a data conductive strip 22 extending along one side of the sensor, while the gate electrode 16 is connected to an addressing conductive strip 24 running along a second side of the sensor. A photoconductive layer 30 and a top electrode 32 are coated over the microplates, the TFT switch, and the addressing and switching strips as shown in FIG. 2. Additional insulation layers not illustrated are often used between the photoconductor and any conductive electrodes in the panel to prevent direct contact between the conductors and the photoconductor layer.

The prior art extends the active image capture area of the first top microplate 14, by using a second top microplate 26 to create a composite top microplate structure. The first top microplate 14 is totally covered by the second top microplate 26. The surface area of the second top microplate 26 is larger than the first and the second top microplate rises above and extends like a mushroom or tent over the TFT switch. As shown in FIG. 2 the second top microplate also extends to cover a portion of the spaces between sensors.

This solution, albeit effective in increasing the active area of the sensor, has the unwanted side effect of shielding the top microplate 14. Because in erasing the sensor following image readout, the array is illuminated with uniform visible radiation which renders the photoconductive layer conductive and results in the redistribution of the charges, it is important that as much light as possible reaches the photoconductive layer in as uniform a manner as possible. Passing through two layers of deposited metal, no matter however transparent, results in some illumination loss. It is therefore desirable to provide a top microplate structure which, while maintaining the efficiency of the dual microplate extended active surface area for charge capture, does this without loss in visible light transmission during the erase cycle.

SUMMARY OF THE INVENTION

The present invention comprises an image capture panel including a substrate layer of dielectric material having a top surface and a bottom surface. A plurality of radiation detection sensors is arrayed in rows and columns on the substrate separated by interstitial spaces, each sensor comprising a charge collecting capacitor formed of a bottom conductive microplate and a generally parallel thereto top conductive microplate separated by a dielectric layer, and a switching element in a space adjacent to the capacitor.

Each sensor further includes a charge collector electrode located at a level higher than the top microplate and the switching element, overlapping the switching element and terminating opposite the top microplate edge, or partially extending over the top microplate along an edge thereof and also partially extending over the interstitial spaces separating the sensors, said charge collecting electrode being electrically connected to said top microplate.

The sensors in the panel are overcoated with a photoconductive layer which is placed over the top microplate and the charge collector electrode, and a top conductive electrode.

DETAILED DESCRIPTION OF THE PREFERRED EMBODIMENT

The invention will next be described in detail with reference to the figures which are used herein by way of illustration rather than limitation. Similar numbers are used in all figures to designate parts common in such figures.

Figure 1:
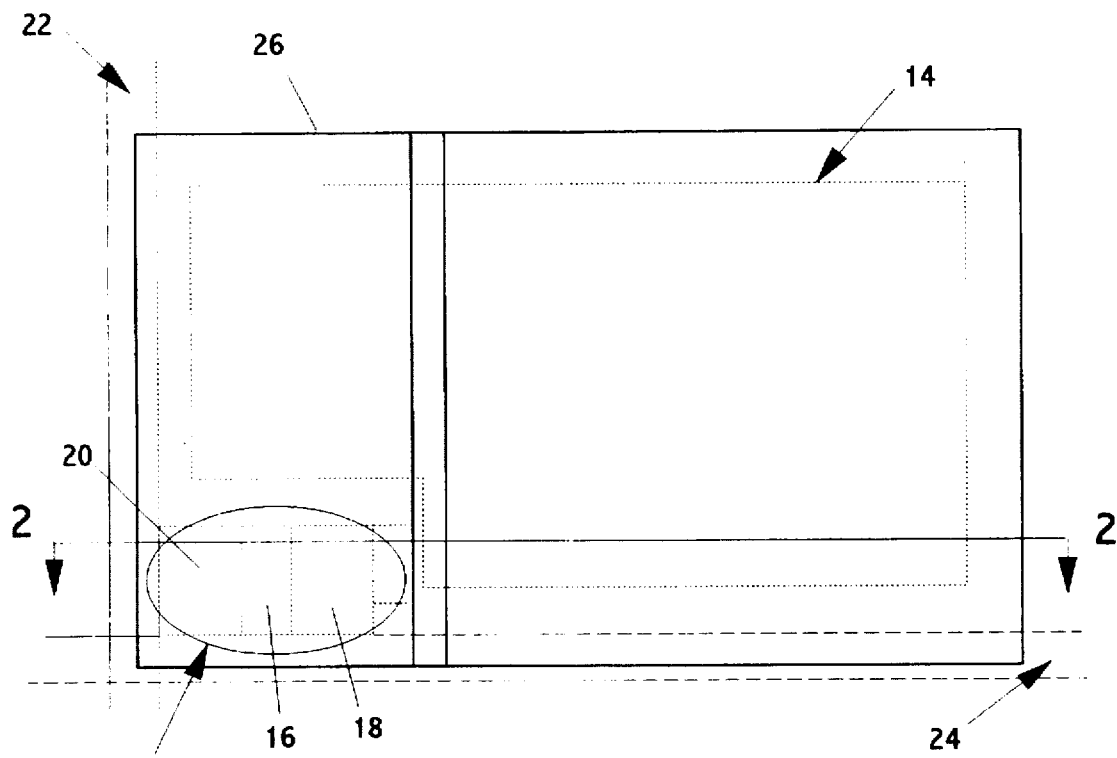
FIG. 1 is a schematic top view of a portion of an image panel according to the prior art.
Figure 2:
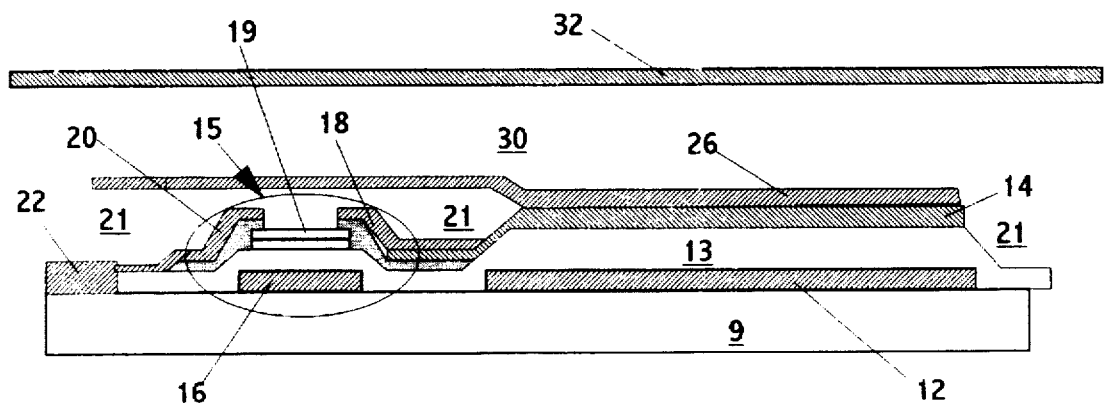
FIG. 2 is a schematic cross-sectional view of the prior art image capture panel of FIG. 1 along arrows 2—2.

FIGS. 1 and 2 which illustrate a typical panel and sensors such as disclosed in U.S. Pat. No. 5,498,880, have been described in the section entitled "Description of related art" above, and are fully described in the issued U.S. Pat. No. 5,498,880 the disclosure of which is incorporated herein and made a part hereof.

Figure 3:
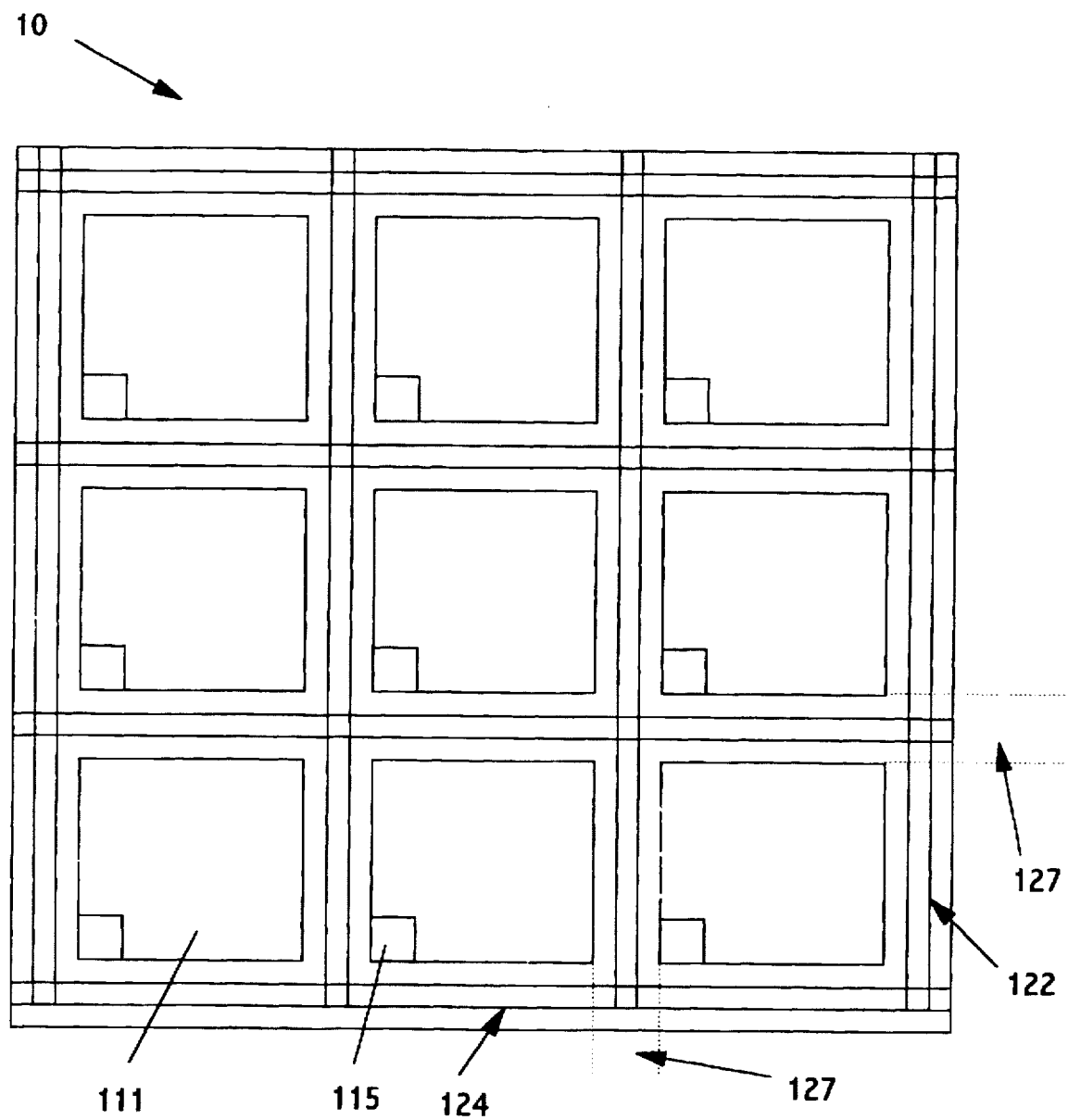
FIG. 3 is a top view of a portion of a radiation detection panel of the type discussed herein.

Referring next to FIG. 3 there is shown a top view of a portion of a panel constructed according to the present invention showing an array of nine sensors 111 arrayed in three rows and three columns. The sensors 111 each include a switching element 115 and are separated from each other by interstitial spaces 127. A plurality of data conductive strips 122 and addressing conductive strips 124 are located in the interstitial spaces 127.

Figure 4:
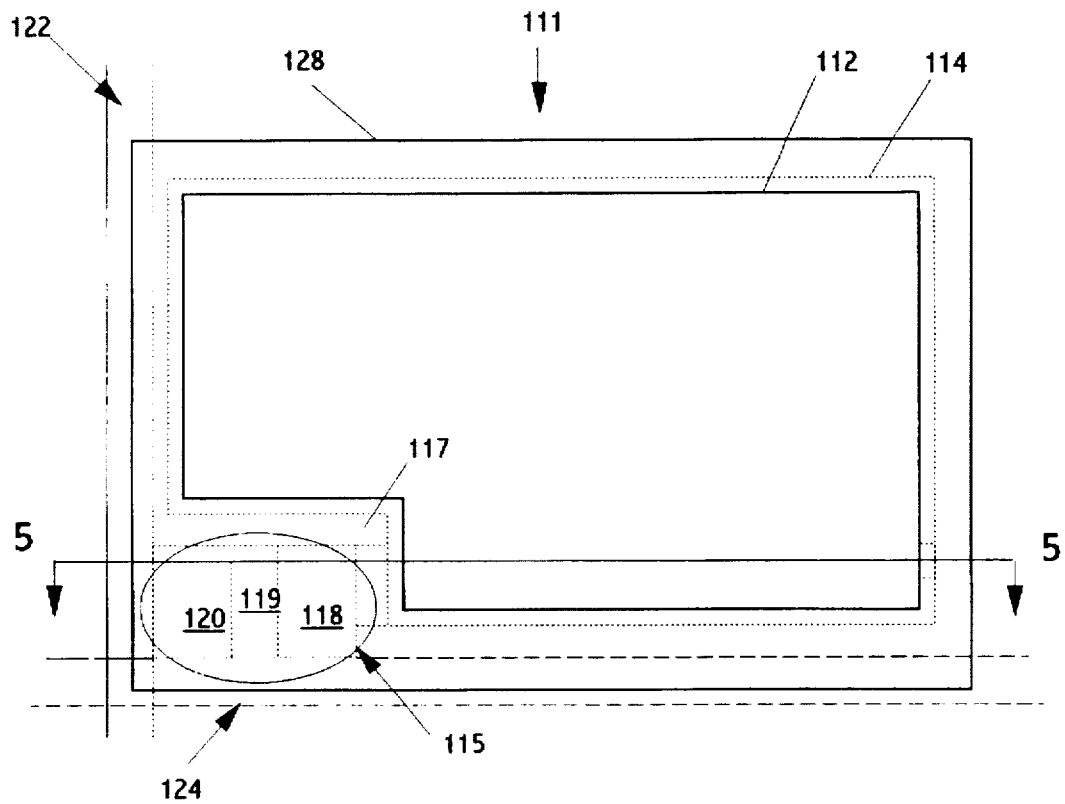
FIG. 4 is a schematic top view of an image sensor of the type used in the image panel shown in FIG. 3, according to the present invention.
Figure 5:
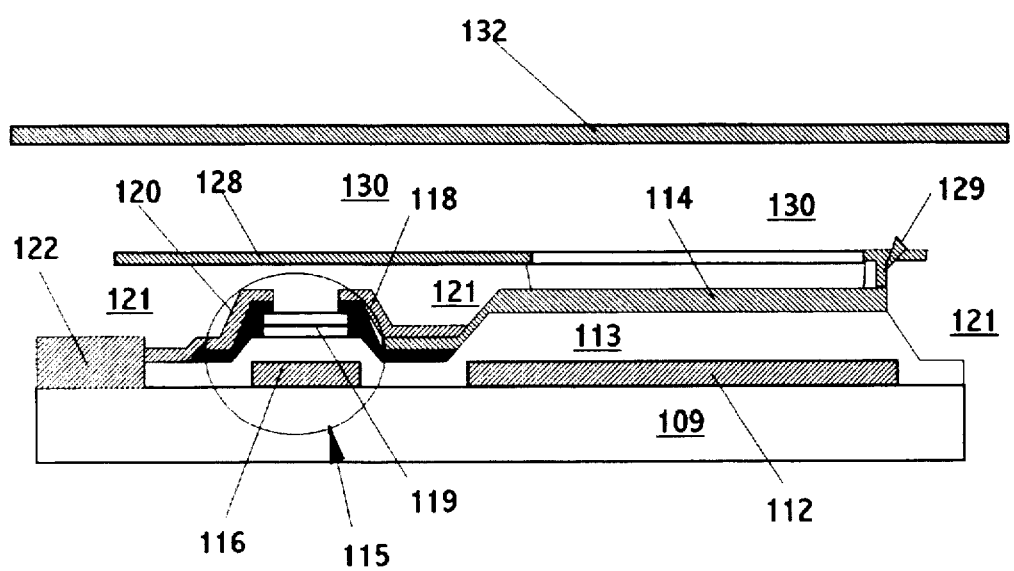
FIG. 5 is a schematic cross-sectional view of the image sensor taken along arrows 5—5 in FIG. 4, according to the present invention.

Referring now to FIGS. 4 and 5 there is shown a top view of a single sensor 111 and an elevation cross section of the sensor taken along arrows 5—5 in FIG. 4. The sensor comprises a dielectric substrate 109 such as a glass substrate. On the substrate 109 there is placed a bottom microplate 112 which is preferably transparent to erasing radiation. When visible spectrum radiation is used in the step of erasing the panel the microplate 112 is preferably transparent to visible radiation. Microplate 112 may be a thin layer of Indium Tin Oxide.

A dielectric insulating layer 113 is deposited over both the gate 116 and the bottom microplate 112. A top microplate 114 is deposited over the dielectric layer 113. Top microplate 114 is substantially coextensive and parallel with the bottom microplate 112. Microplates 112 and 114 together with dielectric 113 form a capacitor.

As shown in FIG. 4, microplates 112 and 114 provide a cutout section 117 at one end, where there is located a switching element such as a TFT transistor 115.

The TFT switching element 115 is constructed in the cutout area 117 using well known technology. In brief, construction of the TFT transistor involves first depositing a gate electrode 116 on the glass plate support 109 and an electrical connection from the gate to the address strip 124. This is followed by the deposition of a semiconductor material 119 on a portion of the gate 116, and two electrodes, the drain electrode 118 and the source electrode 120. The drain and source electrodes are spaced to create a channel space which is filled with a dielectric 121 (see FIG. 5).

Drain electrode 118 is directly connected to the top microplate 114 and source electrode 120 is directly connected to data strip 122.

A dielectric layer 121 is next placed over the TFT switch and the interstitial spaces 127 (shown in FIG. 3) covering all conductive elements or strips and extending to cover at least the edge of top microplate 114. The dielectric layer 121 may overlap a portion of the microplate 114 without effecting the scope of the present invention. Provided there is an opening in the dielectric layer 121 for connecting the collector strip 128 to the top microplate 114, the dielectric layer 121 may extend over the full top microplate 114 area without effecting the scope of the present invention.

Over this layer 121 there is next placed an additional charge collector conductive strip 128 which covers completely the area over the TFT switch. The additional charge collector strip 128 preferably also extends over a portion of the interstitial areas 127 (shown in FIG. 3) and terminates above and opposite the top microplate 114 edge, thus forming a ring like structure which begins where the top microplate ends and extends the useful area of the microplate to the area occupied by the TFT switching element and up to, and optionally into, the non-imaging interstitial spaces without creating a double thickness microplate structure. A connecting strip of electrical conductor 129 is used to provide an electrical conductive path connection between the additional charge collector 128 and the top microplate 114.

The structure described above is preferred, however, only when the precision requirements in masking technology to place the additional charge collector 128 exactly opposite the point where the top microplate ends is far too expensive to be commercially attractive. It has been found that a compromise where the additional charge collector is designed to slightly overlap the top microplate 114 provides substantially all of the benefits of the ideal design without significant deleterious side effects. Such slight overlap is shown in FIGS. 4 and 5.

Following deposition of the additional charge collector 128, the panel is coated with a photoconductive layer 130 such as Selenium, and the photoconductive layer is overcoated with top electrode 132. As is well known in the art, additional insulating and/or passivation layers may be provided between the photoconductive layer and any conductive surfaces it may otherwise be in contact with.

Figure 6:
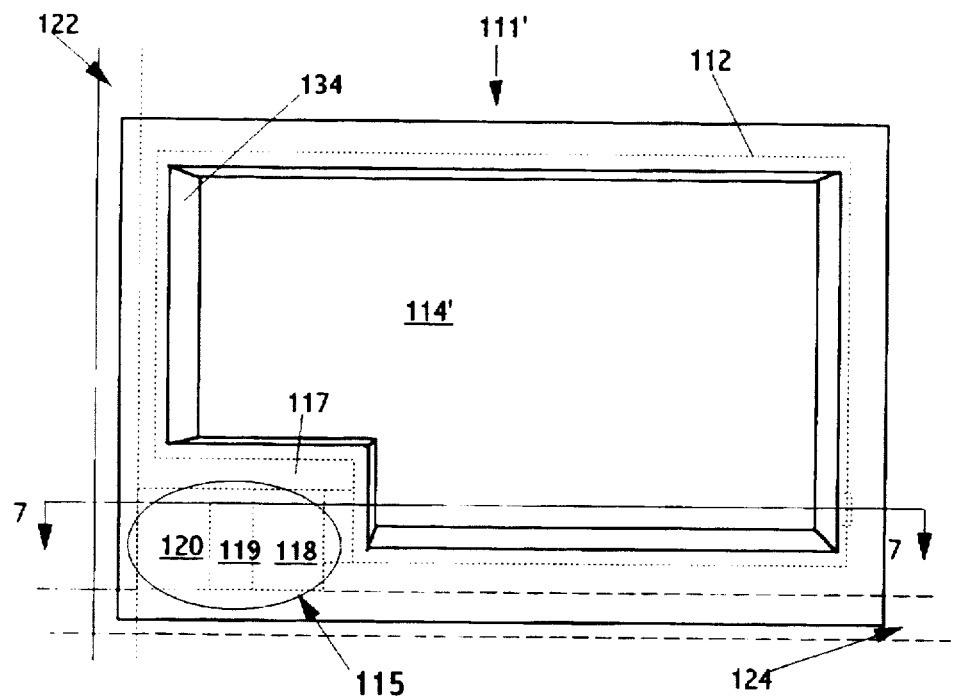
FIG. 6 is a schematic top view of an alternate image capture sensor according to the present invention.
Figure 7:
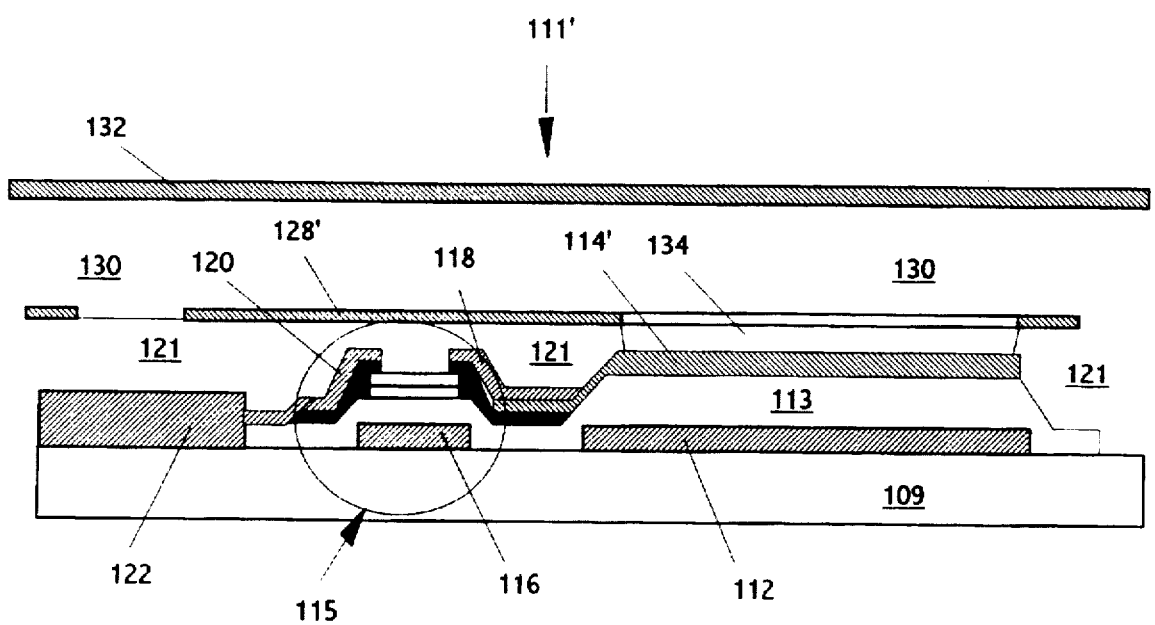
FIG. 7 is a schematic cross-sectional view of the alternate image capture sensor of FIG. 6 taken along arrows 7—7.

FIGS. 6 and 7 depict an alternate embodiment of a sensor 111' wherein the top microplate 114' and the additional charge collecting strip 128' are combined into a single electrode. This is done by bringing the dielectric layer 121 to the edge of top microplate 114'. Next, a conductive layer which extends over the TFT transistor and in the space between the top microplate 114' and the interstitial spaces is deposited over the dielectric layer 121, to form a continuous layer extending along the dielectric layer edge 134 to the top microplate 114'. In this manner there is formed a single charge collecting top microplate which extends continuously over two levels to maximize the charge collecting surface of the pixel. Of course this two level microplate may be created by a single metal deposition following the deposition of the dielectric layers 121 and 113.

The photoconductor layer 130 and top electrode 132 are again deposited over the sensors as before. This structure is advantageous because (1) it avoids any overlap of the top microplate 114' by the additional charge collector 128', and (2) does not leave any areas uncovered.

In the above description, the additional charge collector 128 is always shown to extend around the perimeter of each sensor. While such design maximizes the effective image capture area of the sensor, the charge collector can of course extend only partially around the top microplate. Similarly, the charge collector is shown to extend partially over the interstitial spaces. Again this is not essential but is done to maximize the active image area of the sensor.

This invention has been described in terms of a sensor wherein there is a switching element included with every sensor and wherein such element is a TFT transistor built with the gate electrode in contact with the substrate. However, the present invention is not limited to the particular switch used for its illustration; an inverted TFT switch could be readily substituted without altering the claimed scope. Furthermore, the switching element does not have to be a TFT transistor but any switching element or combination of elements, present in the sensor or its vicinity, which results in decreasing the available effective image capturing area of the sensor is, for purposes of this invention, to be treated as being the same as the TFT switch disclosed and encompassed by my invention. Those having the benefit of the teachings hereinabove set forth may modify the specific sensor structure and various elements or relative placement thereof and such modifications are to be construed as being within the scope of my invention.

I claim:

1. An image capture panel including a substrate layer of dielectric material having a top surface and a bottom surface and a plurality of radiation detection sensors arrayed in a matrix of rows and columns on the substrate separated by interstitial spaces, each sensor surrounded by interstitial spaces and comprising a charge collecting capacitor formed of a bottom conductive microplate and a generally parallel thereto top conductive microplate having at least one side and a surface area, the top and bottom microplates separated by a dielectric layer, and a switching element in a space adjacent to the capacitor, each sensor further including a charge collector electrode electrically connected to the top microplate, located above both the top microplate and the switching element and spaced therefrom, said charge collector electrode extending in the space between the top microplate and the interstitial spaces surrounding the sensor, including the switching element.

2. The image capture panel according to claim 1 wherein the charge collector electrode extends partially over the top microplate along said at least one side thereof, overlapping a portion thereof.

3. The panel according to claim 1 wherein the charge collector electrode also partially extends over the interstitial spaces surrounding the sensor.

4. The panel according to claim 1 wherein the sensors in the panel are overcoated with a photoconductive layer which is placed over the top microplate and the charge collector electrode, and the photoconductive layer is covered by a top conductive electrode.

5. The panel according to claim 1 wherein the additional charge collecting electrode extends to the at least one side of the top electrode, is physically connected to said side, and is continuous therewith.

* * * * *